(12) United States Patent
Jung et al.

(10) Patent No.: US 12,740,087 B2
(45) Date of Patent: Sep. 15, 2026

(54) POWER SEMICONDUCTOR DEVICE AND MANUFACTURING METHOD THEREOF

(71) Applicant: DB HiTek Co., Ltd., Bucheon-si (KR)

(72) Inventors: Ji Houn Jung, Seoul (KR); Dae Il Kim, Cheongju-si (KR); Han Seok Ko, Seoul (KR); Ung Bi Son, Bucheon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 452 days.

(21) Appl. No.: 18/312,227

(22) Filed: May 4, 2023

(65) Prior Publication Data

US 2024/0243195 A1 Jul. 18, 2024

(30) Foreign Application Priority Data

Jan. 16, 2023 (KR) ........................ 10-2023-0005848

(51) Int. Cl.

*H10D 30/01* (2025.01)
*H10D 30/47* (2025.01)
*H10D 62/17* (2025.01)
*H10P 50/24* (2026.01)

(52) U.S. Cl.

CPC ......... *H10D 30/475* (2025.01); *H10D 30/015* (2025.01); *H10D 62/235* (2025.01); *H10P 50/242* (2026.01)

(58) Field of Classification Search

CPC .. H10D 30/015; H10D 30/475; H10D 64/513; H10D 30/471

See application file for complete search history.

(56) References Cited

U.S. PATENT DOCUMENTS

| | | | | |
|---|---|---|---|---|
| 2015/0236095 A1* | 8/2015 | Mueller | H10D 30/475 | 257/24 |
| 2015/0263155 A1* | 9/2015 | Fujimoto | H10D 30/475 | 257/76 |
| 2017/0263742 A1* | 9/2017 | Endoh | H10D 30/015 | |
| 2017/0338810 A1* | 11/2017 | Chen | H10D 30/475 | |
| 2020/0219987 A1* | 7/2020 | Lee | H10D 30/475 | |
| 2022/0157977 A1* | 5/2022 | Lei | H10D 30/475 | |
| 2022/0238694 A1* | 7/2022 | Yang | H10D 30/015 | |

FOREIGN PATENT DOCUMENTS

| | | |
|---|---|---|
| JP | 2006-286740 A | 10/2006 |
| KR | 10-2020-0068745 A1 | 6/2020 |
| KR | 10-2445520 B1 | 9/2022 |
| KR | 10-2022-0136002 A | 10/2022 |

* cited by examiner

*Primary Examiner* — Eric K Ashbahian

(74) *Attorney, Agent, or Firm* — Bridgeway IP Law Group, PLLC; Jihun Kim

(57) ABSTRACT

Proposed is a power semiconductor device in which an upper surface of a barrier layer between a gate electrode and a drain electrode has a stepped recess portion, thereby being capable of effectively controlling electric field strength at an interface positioned adjacent to the drain electrode and effectively restraining a carrier trap between the gate electrode and the drain electrode.

12 Claims, 16 Drawing Sheets

POWER SEMICONDUCTOR DEVICE AND MANUFACTURING METHOD THEREOF

CROSS REFERENCE TO RELATED APPLICATION

The present application claims priority to Korean Patent Application No. 10-2023-0005848, filed Jan. 16, 2023, the entire contents of which are incorporated herein for all purposes by this reference.

BACKGROUND OF THE INVENTION

Field of the Invention

The present disclosure pertains to a power semiconductor device and a manufacturing method thereof. More specifically, the present disclosure relates to a power semiconductor device and its manufacturing method in which an upper surface of a barrier layer between a gate electrode and a drain electrode has a stepped recess portion. This structure is capable of effectively controlling electric field strength at an interface adjacent to the drain electrode and effectively restraining a carrier trap between the gate electrode and the drain electrode.

Description of the Related Art

A nitride semiconductor is commonly utilized in high withstand voltage and high output power semiconductor devices due to its high saturation electron velocity and wide band gap characteristics. Gallium nitride (GaN) stands out in particular for its wider band gap and higher breakdown electric field characteristics compared to silicon and gallium arsenide (GaAs), making it an excellent choice for transistors with high breakdown voltage capabilities.

Moreover, a GaN-based device offers higher electron mobility and saturation velocity compared to the commonly used silicon-based devices, resulting in superior high frequency characteristics. This high electron mobility also leads to an improved on-resistance characteristic, making it possible to realize low-loss switching elements.

Given the desirable combination of high frequency and high power capabilities offered by GaN-based Field Effect Transistors (FETs), research efforts have been ongoing in this area. While there have been significant advancements in the development of GaN-based FETs over the past few years, several challenges remain in ensuring their reliability in practical applications. One of the critical issues that must be addressed relates to the current collapse effect caused by traps present in a semiconductor.

FIG. 1 is a partial cross-sectional view illustrating a conventional power semiconductor device.

Hereinafter, a schematic structure and problems of a conventional power semiconductor device 9 will be described with reference to the attached drawing.

Referring to FIG. 1, in a conventional power semiconductor device 9, the drain electrode 950 may be subjected to a voltage higher than that applied to the source electrode 910 and the gate electrode 930, resulting in carrier trapping between the gate electrode 930 and the drain electrode 950. This carrier trapping causes a current collapse effect, which in turn may lead to a 'memory' effect where the device's conduction current varies depending on the duration of the previously applied voltage. For instance, during transistor operation, electrons can become trapped in the epitaxial or dielectric layer, hindering the conduction of electrons moving through the 2DEG layer 970. This can increase the channel resistance, which is a significant problem.

To address these issues, the inventors of the present disclosure have developed a novel power semiconductor device with an improved structure and a manufacturing method thereof. A detailed description will be provided later in this disclosure.

Document of Related Art (Patent Document 1) Korean Patent Application Publication No. 10-2020-0068745 'HIGH ELECTRON MOBILITY TRANSISTOR'

SUMMARY OF THE INVENTION

The present disclosure addresses the aforementioned issues in the related art and aims to provide a power semiconductor device and its manufacturing method that feature an upper surface with a stepped recess portion in a barrier layer between a gate electrode and a drain electrode. This innovative structure allows for effective control of the electric field strength at an interface adjacent to the drain electrode and helps prevent carrier trapping between the gate electrode and the drain electrode. Additionally, another objective of the present disclosure is to provide a power semiconductor device and a manufacturing method thereof with a stepped recess structure that can more effectively prevent carrier trapping between the gate and drain electrodes by forming a recess with both narrow and wide recess portions. Furthermore, another objective of the present disclosure is to provide a power semiconductor device and a manufacturing method thereof with a plurality of spaced-apart recess portions in an orthogonal direction, which can more effectively prevent carrier trapping and prevent excessive reduction in device current.

Moreover, yet another objective of the present disclosure is to provide a power semiconductor device and a manufacturing method thereof with narrow and wide recess portions that can be formed simultaneously using a single etching process, thereby improving process efficiency.

The present disclosure may be implemented through one or more embodiments having some or all of the following features, in order to achieve one or more of the objectives described above.

According to an embodiment of the present disclosure, there is provided a power semiconductor device including: a substrate; a channel layer disposed on or over the substrate; a barrier layer disposed on the channel layer; a capping layer disposed on the barrier layer; a gate electrode disposed on the capping layer; a source electrode and a drain electrode that are separated from the gate electrode, the source electrode and the drain electrode forming ohmic contact regions on the barrier layer; and an insulation film disposed on the barrier layer, wherein the barrier layer is configured such that a first side of an upper surface of the barrier layer is stepped between the gate electrode and the drain electrode.

In the present disclosure, the barrier layer may have a stepped structure in which the first side of the upper surface of the barrier layer is recessed downward from the gate electrode to the drain electrode.

In the present disclosure, the barrier layer may include a first recess portion, the first recess portion being spaced apart from an edge of the drain electrode on the upper surface of the barrier layer and being recessed downward.

In the present disclosure, the first recess portion may include a plurality of first recess sub-portions, and the plurality of first recess sub-portions are spaced apart from each other along an orthogonal direction.

In the present disclosure, the barrier layer may further include a second recess portion, the second recess portion being recessed downward between the first recess portion and the drain electrode on the upper surface of the barrier layer.

In the present disclosure, the second recess portion may have a horizontal width greater than a horizontal width of the first recess portion.

In the present disclosure, the second recess portion may have an orthogonal width greater than an orthogonal width of the first recess portion.

In the present disclosure, a recessed depth of the second recess portion may be greater than a recessed depth of the first recess portion.

In the present disclosure, the second recess portion may be formed substantially simultaneously with the first recess portion.

In the present disclosure, the second recess portion may be physically connected to the first recess portion.

According to another embodiment of the present disclosure, there is provided a power semiconductor device including: a substrate; a buffer layer disposed on the substrate; a channel layer disposed on or over the substrate, the channel layer being a nitride-based semiconductor layer; a barrier layer disposed on the channel layer, the barrier layer being a nitride-based semiconductor layer that is different from the channel layer; a capping layer disposed on the barrier layer; a gate electrode disposed on the capping layer; and a source electrode and a drain electrode that are separated from the gate electrode, the source electrode and the drain electrode forming ohmic contact regions on the barrier layer, wherein the barrier layer includes a recess portion that includes: a narrow recess portion positioned between the drain electrode and the gate electrode; and a wide recess portion positioned between the narrow recess portion and the drain electrode, the wide recess portion being connected to the narrow recess portion.

In the present disclosure, the recess portion may include a plurality of recess sub-portions, and the plurality of recess sub-portions may be spaced apart from each other along an orthogonal direction on an upper surface of the barrier layer.

In the present disclosure, the narrow recess portion may have a horizontal central axis that is substantially parallel to a horizontal central axis of the wide recess portion to which the narrow recess portion is connected.

In the present disclosure, a recessed depth of the wide recess portion may be greater than a recessed depth of the narrow recess portion, so that a first side of an upper surface of the barrier layer may have a stepped structure that is recessed downward from the gate electrode to the drain electrode.

In the present disclosure, the recess portion may have a pair of narrow recess portions respectively connected to a pair of wide recess portions, and the recess portion may have an additional narrow recess portion of an island structure, the additional narrow recess portion being positioned between the pair of narrow recess portions in an orthogonal direction thereof.

In the present disclosure, the recess portion may be formed by a plasma etching process.

According to an embodiment of the present disclosure, there is provided a manufacturing method of a power semiconductor device, the manufacturing method including: forming a channel layer on or over a substrate, wherein the channel layer is a nitride-based semiconductor layer including GaN; forming a barrier layer on the channel layer, wherein the barrier layer is a nitride-based semiconductor layer including AlGaN; forming a capping layer of a first conductivity type on the barrier layer; forming a recess portion on a first side of an upper surface of the barrier layer, the recess portion being recessed downward; forming a gate electrode on the capping layer; forming an insulation film on the barrier layer; and forming a source electrode and a drain electrode on the barrier layer.

In the present disclosure, the recess portion may include: a narrow recess portion positioned between the drain electrode and the gate electrode on the upper surface of the barrier layer; and a wide recess portion positioned between the narrow recess portion and the drain electrode on the upper surface of the barrier layer, the wide recess portion being connected to the narrow recess portion.

In the present disclosure, the forming the recess portion may include forming a mask pattern on the upper surface of the barrier layer having a substantially flat upper surface, wherein the mask pattern may be configured such that a width to an open space at a side where the narrow recess portion is to be formed is smaller than a width to an open space at a side where the wide recess portion is to be formed.

In the present disclosure, the forming the barrier layer may further include performing a plasma etching on the first side of the upper surface of the barrier layer by utilizing the mask pattern.

According to the above-described configurations, the present disclosure has the following technical advantages.

First, the upper surface of the barrier layer between the gate electrode and the drain electrode has a stepped recess portion, which effectively controls the electric field strength at the interface adjacent to the drain electrode and restrains the carrier trap between the gate electrode and the drain electrode. Second, the recess portion is formed in a stepped structure with narrow and wide recess portions, which more effectively restrains the carrier trap between the gate electrode and the drain electrode. Third, a plurality of recess portions is formed at intervals along the orthogonal direction, which effectively restrains the carrier trap and prevents a reduction in the device's current beyond the required amount. Fourth, a single etching process forms both the narrow and wide recess portions, which prevents a deterioration in process efficiency. Meanwhile, even though not explicitly mentioned, advantages described in the present specification and tentative advantages, expected from the technical features of the present specification, will be treated as described in the present disclosure.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in detail with reference to accompanying drawings. Various changes to the following embodiments are possible and the scope of the present disclosure is not limited to the following embodiments. The patent right of the present disclosure should be defined by the scope and spirit of the present disclosure as disclosed in the accompanying claims. In addition, embodiments of the present disclosure are intended to fully describe the present disclosure to a person having ordinary knowledge in the art to which the present disclosure pertains.

Hereinafter, when it is described that a component (or a layer) is referred to as being on another component (or another layer), it should be understood that the component is directly on the other component, or one or more intervening components (or layers) are also present. In contrast, when it is described that a component is referred to as being directly on to another component, it should be understood that there is (are) no intervening component(s) present. In addition, the terms indicating positions, such as, being located 'on', 'upper', 'lower', 'upper side', 'lower side', 'first side', and 'side surface' are intended to mean a relative position of the components.

The terms 'first', 'second', 'third', etc. may be used to describe various items, such as various elements, regions, and/or parts, but the items are not limited by the terms.

In addition, when a specific embodiment may be implemented differently, a specific process order may be performed differently from the described order. For example, two consecutively described processes may be performed substantially at the same time or performed in an order opposite to the described order.

In addition, conductivity types or doped areas of elements may be defined as 'p-type' or 'n-type' according to main carrier characteristics, but this is only for convenience of description, and the technical idea of the present disclosure is not limited thereto. For example, hereinafter, the 'p-type' or 'n-type' will be referred to as more general terms a 'first conductivity type' or 'second conductivity type'. Herein, the first conductivity type may refer to p-type conductivity, and the second conductivity type may refer to n-type conductivity.

In addition, it is to be understood that the terms 'high-concentration' and 'low-concentration' in reference to the doping concentration in an impurity region refer to relative doping concentrations of one impurity region relative to another impurity region.

Hereinafter, on the illustrated plan view (FIG. 2), an X-axis direction is described as a 'horizontal direction', and a Y-axis direction is described as an 'orthogonal direction'.

Figure 2:
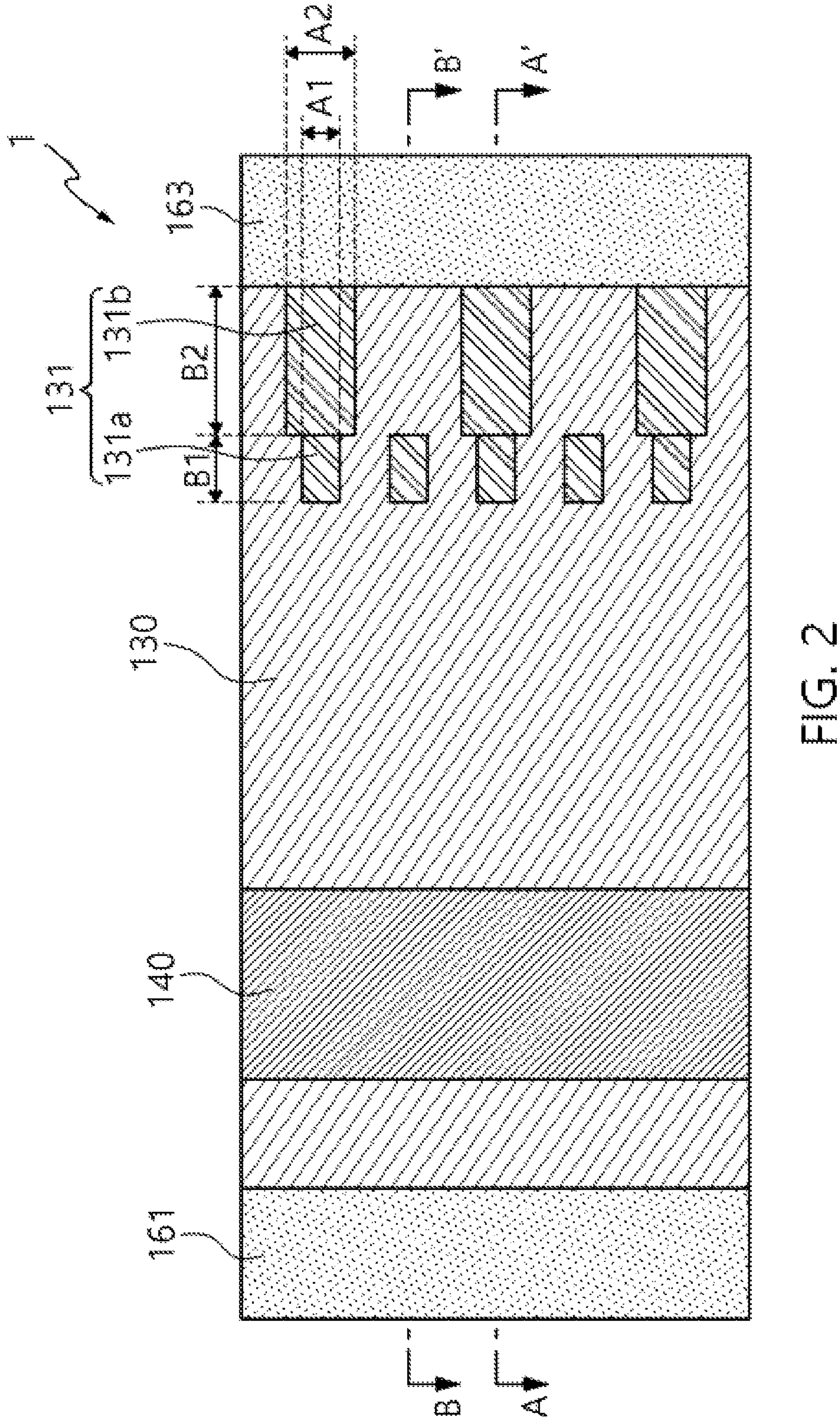
FIG. 2 is a plan view illustrating a power semiconductor device according to an embodiment of the present disclosure.
Figure 3:
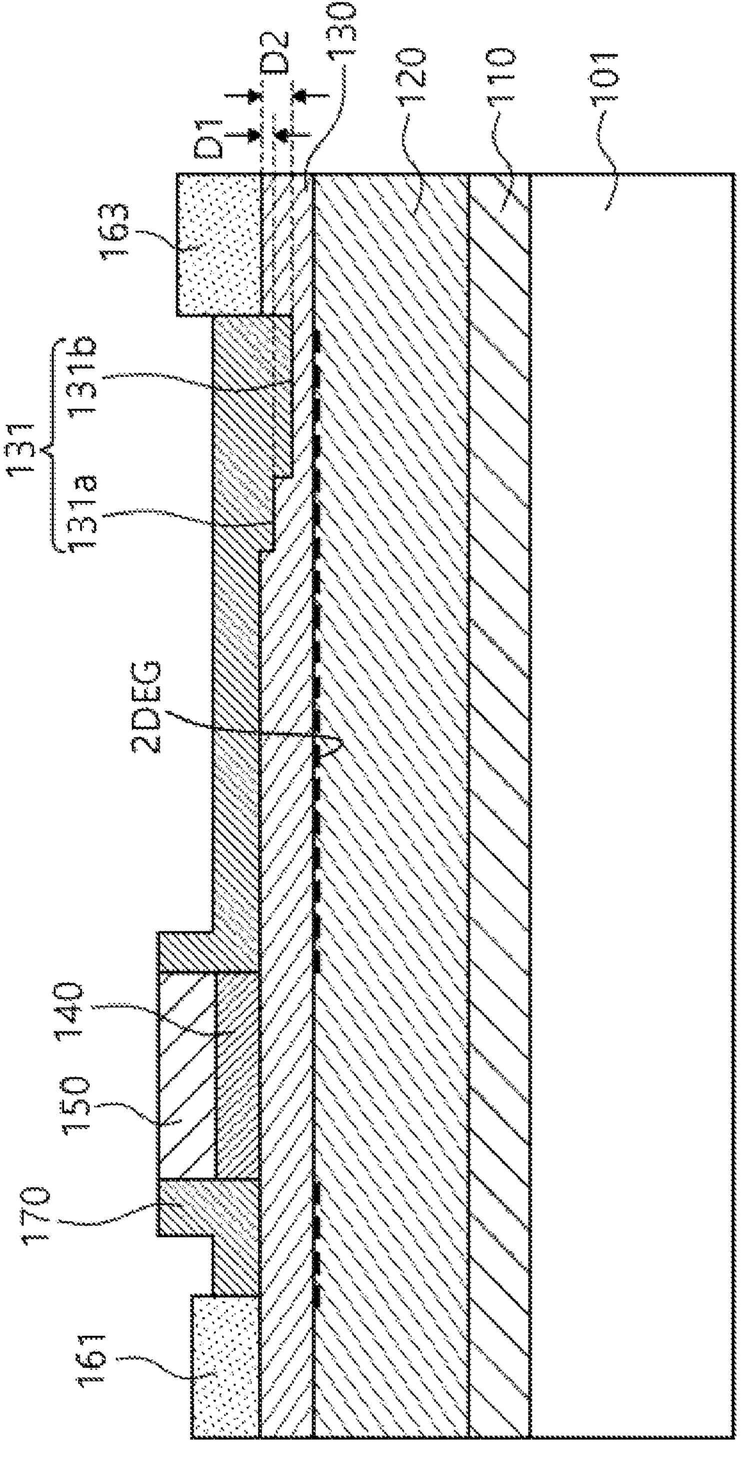
FIG. 3 is a cross-sectional view illustrating the power semiconductor device taken along line A-A' in FIG. 2.
Figure 4:
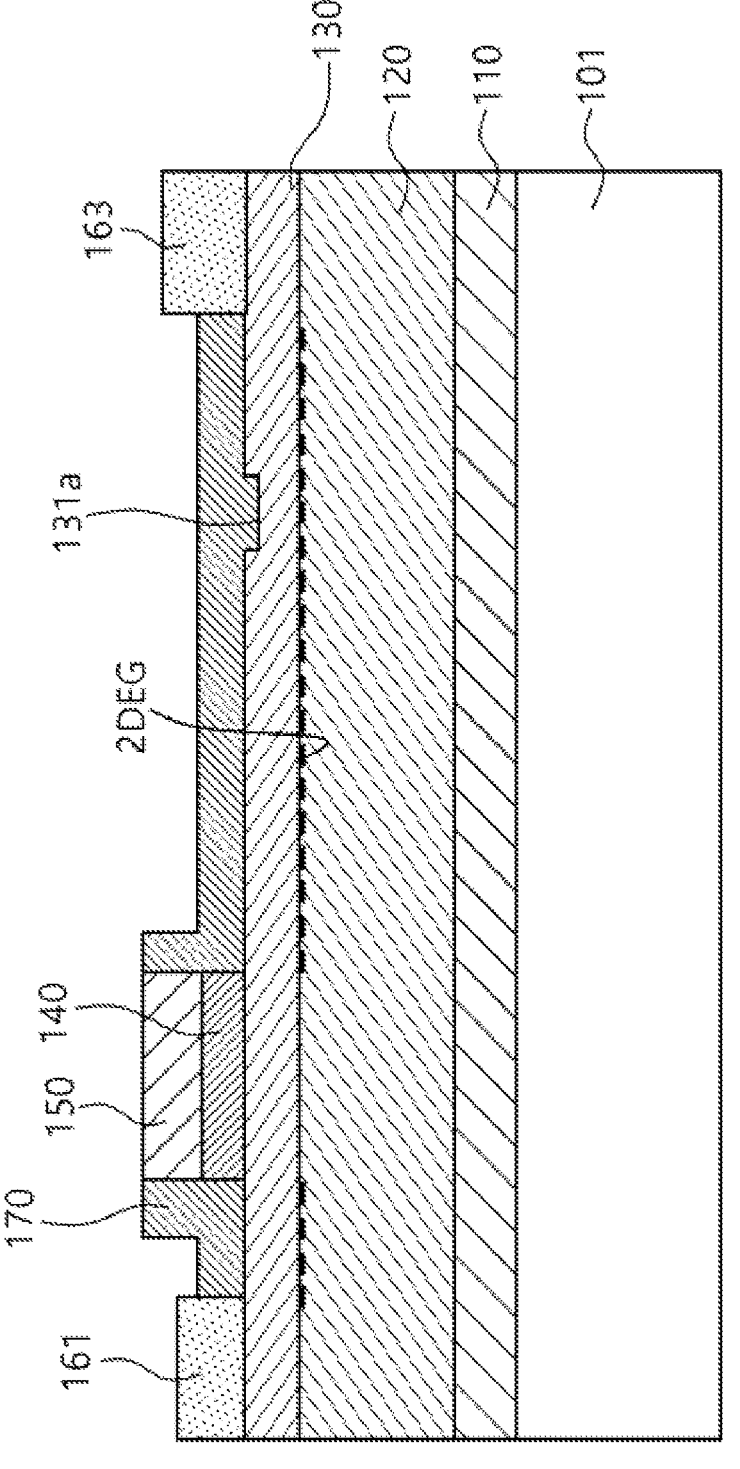
FIG. 4 is a cross-sectional view illustrating the power semiconductor device taken along line B-B' in FIG. 2.

FIG. 2 is a plan view illustrating a power semiconductor device according to an embodiment of the present disclosure, FIG. 3 is a cross-sectional view illustrating the power semiconductor device taken along line A-A' in FIG. 2, and FIG. 4 is a cross-sectional view illustrating the power semiconductor device taken along line B-B' in FIG. 2. It should be noted that illustration of an insulation film and a gate electrode are omitted in FIG. 2 for the convenience of the description.

Hereinafter, a power semiconductor device 1 according to an embodiment of the present disclosure will be described in detail with reference to the accompanying drawings.

Referring to FIGS. 2 to 4, the present disclosure relates to a power semiconductor device 1. More specifically, the present disclosure relates to a power semiconductor device 1 in which an upper surface of a barrier layer 130 between a gate electrode 150 and a drain electrode 163 has a stepped recess portion 131. This structure is capable of effectively controlling electric field strength at an interface adjacent to the drain electrode 163 and effectively restraining a carrier trap between the gate electrode 150 and the drain electrode 163.

To this end, the power semiconductor device 1 may include a substrate 101, a buffer layer 110, a channel layer 120, the barrier layer 130, a capping layer 140, the gate electrode 150, a source electrode 161, the drain electrode 163, and an insulation film 170.

The substrate 101 is a substrate for growth, and may be a silicon substrate as an example, but is not limited thereto. As another example, the substrate 101 may be a sapphire substrate, a GaN substrate, or a SiC substrate. In the present disclosure, an example in which the substrate 101 is a silicon substrate will be described.

The buffer layer 110 is a layer formed on the substrate 101 and, for example, may be formed by growing AlN to a predetermined thickness on the substrate 101. Otherwise, the buffer layer 110 may have a form in which at least one composite layer of GaN and AlGaN are grown, but is not limited thereto. Such a buffer layer 110 may have a structure for preventing stress caused by large difference in lattice constant values and thermal expansion coefficients between the substrate 101 and the channel layer 120 that will be described later. The buffer layer 110 may be doped with impurities such as C and/or Fe.

The channel layer 120 may be formed on the substrate 101. More preferably, the channel layer 120 is formed on the buffer layer 110 such that the channel layer 120 has a predetermined thickness. For example, the channel layer 120 may be formed of a nitride-based semiconductor layer such as GaN and so on. In addition, the barrier layer 130 is formed on the channel layer 120 such that the barrier layer 130 has a predetermined thickness, and may be a nitride-based semiconductor layer such as AlGaN and so on as an example. It is preferable that such a channel layer 120 and such a barrier layer 130 are formed of different nitride-based semiconductor layers. With such a structure, a 2-Dimensional Electron Gas (2DEG) layer may be formed close to an interface between the channel layer 120 and the barrier layer 130. The density and mobility of the 2DEG layer can be controlled by adjusting the content of Al and Ga in the barrier layer 130. The 2DEG layer may also be formed in the channel layer 120.

In addition, the barrier layer 130 may be formed such that the barrier layer 130 has the recess portion 131 between the gate electrode 150 and the drain electrode 163. That is, at least a first side of an upper surface of the barrier layer 130 has a stepped structure that is stepped downward as the structure extends to the drain electrode 163 from the gate electrode 150. In addition, the recess portion 131 may include a plurality of recess portions 131 such that the plurality of recess portions extends in a horizontal direction and is spaced apart from each other along an orthogonal direction. As the recess portions 131 are continuously arranged along the orthogonal direction, as described above, they effectively restrain carrier traps, and prevent the device 1 from reducing the amount of current more than required.

The plurality of recess portions 131 have sides spaced apart from each other, which contributes to this effect.

Referring to FIG. 2, the recess portion 131 may include a narrow recess portion 131*a* and a wide recess portion 131*b*. The narrow recess portion 131*a* has an orthogonal width less than an orthogonal width of the wide recess portion 131*b* (A1<A2). In addition, preferably, the narrow recess portion 131*a* is formed such that the narrow recess portion 131*a* has a horizontal width less than a horizontal width of the wide recess portion 131*b* (B1<B2). Such a narrow recess portion 131*a* is spaced apart from the drain electrode 163 and, as an example, it is preferable that the narrow recess portion 131*a* is spaced apart from the drain electrode by a predetermined distance along the horizontal direction.

In addition, the narrow recess portion 131*a* may be physically connected to the adjacent wide recess portion 131*b* along the horizontal direction (see FIG. 3), or may be spaced apart from the drain electrode 163 and may be formed in an island type (see FIG. 4), and the scope of the present disclosure is not limited to the specific example. Preferably, such a narrow recess portion 131*a* is formed at substantially the same horizontal position along a vertical direction. For example, a plurality of narrow recess portions 131*a* may be spaced apart from each other along the vertical direction so as to be provided in substantially the same column. For example, the plurality of narrow recess portions 131*a* may be formed such that the narrow recess portions 131*a* have the same central axis along the vertical direction within an error range.

In addition, the narrow recess portion 131*a* may be formed such that a recessed depth of the narrow recess portion 131*a* from the upper surface of the barrier layer 130 is less than a recessed depth of the wide recess portion 131*b* (D1<D2). Therefore, when the narrow recess portion 131*a* and the wide recess portion 131*b* are connected to each other along the horizontal direction, the first side of the upper surface of the barrier layer 130 may have the stepped structure that is stepped downward as the structure extends to the drain electrode 163 from the gate electrode 150 (see FIG. 3). In addition, a first end portion of the wide recess portion 131*b* may extend to an edge of the drain electrode 163, or may extend to a side adjacent to the edge of the drain electrode 163, but there is no specific limitation. In addition, preferably, when the narrow recess portion 131*a* is connected to the wide recess portion 131*b*, each central axis in the horizontal direction of the components 131*a* and 131*b* substantially coincide with each other within an error range. Referring to FIG. 2, the narrow recess portion 131*a* and the wide recess portion 131*b* have quadrangular planar shapes, but may have substantially curved shapes in which each edge portion of the quadrangular planar shapes are cut off, but there is no specific limitation.

In the cross-sectional view illustrated in FIG. 3, the recess portion 131 has a side that is formed in a two-stage structure in which one narrow recess portion 131*a* and one wide recess portion 131*b* are formed along the horizontal direction, but the recess portion 131 may be formed in a structure of three or more stages. It is preferable that the recess portion closest to the drain electrode 163 has the deepest depth and the largest horizontal and vertical widths. That is, when the recess portion 131 is formed in a multi-stage structure of two or more stages, the stepped structure that is stepped downward as the structure extends to the drain electrode 163 from the gate electrode 150 may be formed.

In addition, on upper surfaces of the narrow recess portion 131*a* and the wide recess portions 131*b*, preferably, on an upper surface of an etching stop film, the insulation film 170 that will be described later may be formed.

Hereinafter, a schematic structure and problems of a conventional power semiconductor device 9 and together with advantages of the present disclosure will be described with reference to the attached drawings.

Figure 1:
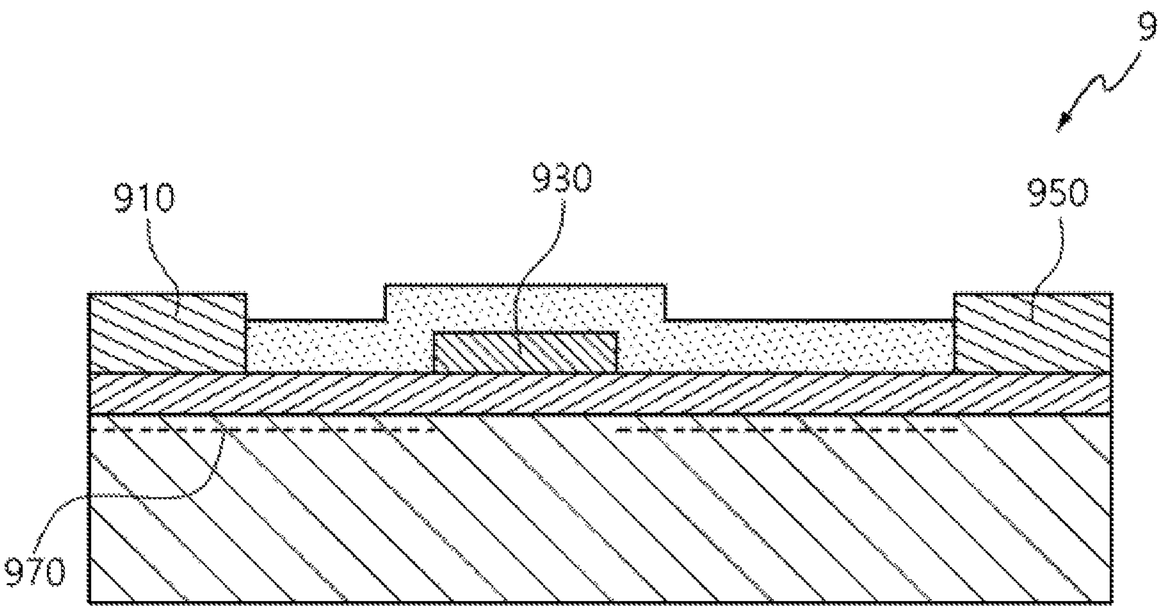
FIG. 1 is a partial cross-sectional view illustrating a conventional power semiconductor device.

Referring to FIG. 1, in a conventional power semiconductor device 9, when a voltage higher than the voltages applied to a source electrode 910 and a gate electrode 930 is applied to a drain electrode 950, carriers may be trapped between the gate electrode 930 and the drain electrode 950. This results in a current collapse effect which may cause a 'memory' effect, where a conduction current of a device varies according to the duration of a previously applied voltage. For instance, during the transistor operation, electrons can become trapped in an epitaxial layer or a dielectric layer. These trapped electrons can obstruct the movement of electrons through a channel, making it difficult to conduct current through a 2DEG layer 970. This situation increases the resistance of the channel, which is problematic.

Referring to FIGS. 2 to 4, as described above, the power semiconductor device 1 according to an embodiment of the present disclosure includes the recess portion 131 in which at least the first side of the upper surface of the barrier layer 130 has the stepped structure that is stepped downward as the structure extends to the drain electrode 163 from the gate electrode 150. By using such a recess portion 131, there are advantages that electric field strength at an interface positioned at a side adjacent to the drain electrode 163 may be effectively controlled and, accordingly, desired breakdown voltage characteristics may be secured, and a carrier trap may be effectively restrained by using a continuous arrangement.

An etching stop film (not illustrated) may be formed on an upper surface of the barrier layer 130, and the etching stop film may be formed by growing an AlN epitaxial layer.

The capping layer 140 is configured such that the capping layer 140 is formed below the gate electrode 150 on the barrier layer 130. For example, it is preferable that the capping layer 140 is a first conductivity type doping region and has a positive polarity. When such a capping layer 140 is formed such that the capping layer 140 has a predetermined thickness or more, a distance from the gate electrode 150 to the 2DEG layer increases, so that a response speed is reduced. Conversely, when the capping layer 140 is formed such that the capping layer 140 has the predetermined thickness or less, a normally-off operation is difficult to be performed. Therefore, preferably, the capping layer 140 has an appropriate thickness, and the appropriate thickness is within a range of 10 nm to 1000 nm, but there is no limitation. In addition, the capping layer 140 may be formed by growing p-GaN and, as an example, the capping layer 140 may be formed by doping Mg in GaN.

The capping layer 140 is substantially formed at the bottom portion of the gate electrode 150, and the 2DEG layer is formed such that the 2DEG layer does not exist below the capping layer 140 when no operation is performed. Therefore, when a gate voltage is turned-off, the 2DEG layer does not exist in the channel layer 120 and the normally-off operation is performed. When the gate voltage is turned-on, the 2DEG layer is formed and is capable of being operated.

For example, on the barrier layer 130, the gate electrode 150 is a configuration formed on the capping layer 140, and may be formed of a single layer or a composite layer of various arbitrary metals such as Ti, Pd, and so on, as an example. In addition, the gate electrode 150 is configured to perform the normally-off operation, and a depletion layer of the gate electrode 150 reaches the channel layer 120 by passing through the barrier layer 130, thereby being capable of blocking the 2DEG layer.

The source electrode 161 and the drain electrode 163 are spaced apart from the gate electrode 150 and are ohmic contact regions formed on the barrier layer 130, and may be formed in step shapes or quadrangle shapes in cross-section. However, it should be noted that the source electrode 161 and the drain electrode 163 may be formed in various other structures. As an example, the source electrode 161, the gate electrode 150, and the drain electrode 163 may be formed to be spaced apart from each other sequentially along the horizontal direction. In addition, as an example, the source electrode 161 and the drain electrode 163 may be formed of single layers or composite layers of various arbitrary metals such as Ti, Au, Al, and so on to be capable of ohmic contacting, but there is no limitation.

As an example, the insulation film 170 may be formed of an electrically insulative material. Such an insulation film 170 may be formed on the barrier layer 130. In addition, the insulation film 170 may be formed up to a position where the insulation film 170 does not cover the source electrode 161 and the drain electrode 163, or a position where the insulation film 170 covers the source electrode 161 and the drain electrode 163. As an example, the insulation film 170 may be formed by depositing $Al_2O_3$ on the barrier layer 130 such that $Al_2O_3$ covers both the source electrode 161 and the drain electrode 163, and then by forming openings H on upper sides of the source electrode 161 and the drain electrode 163.

FIGS. 5 to 16 are cross-sectional views illustrating a manufacturing method of the power semiconductor device according to an embodiment of the present disclosure.

Hereinafter, a manufacturing method of the power semiconductor device according to an embodiment of the present disclosure will be described in detail with reference to the accompanying drawings.

Figure 5:
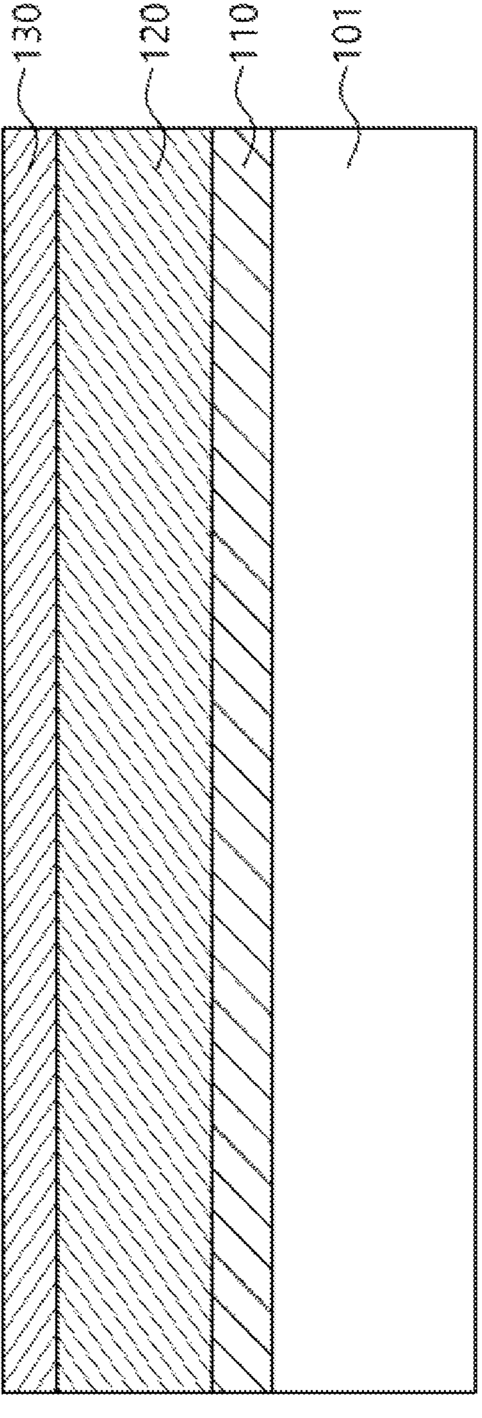
FIGS. 5 to 16 are cross-sectional views illustrating a manufacturing method of the power semiconductor device according to an embodiment of the present disclosure.

First, referring to FIG. 5, on the substrate 101, the buffer layer 110, the channel layer 120, and the barrier layer 130 having a substantially flat upper surface are sequentially formed. As described above, the substrate 101 is a substrate for growth, and may be any one of a silicon substrate, a sapphire substrate, a GaN substrate, and a SiC substrate. In the present disclosure, an example in which the substrate 101 is a silicon substrate will be described. The buffer layer 110 may be formed on the substrate 101 and below the channel layer 120 by growing an AlN layer to a predetermined thickness as an example.

In addition, the channel layer 120 formed on the buffer layer 110 is a nitride-based semiconductor layer such as GaN and so on, the barrier layer 130 is a nitride-based semiconductor layer such as AlGaN and so on, and the 2DEG layer (not illustrated) may be formed by electrons accumulated in an interface between the channel layer 120 and the barrier layer 130. As a detailed explanation, due to the difference in lattice constant between GaN and AlGaN, a piezo polarization may occur at the interface between the channel layer 120 and the barrier layer 130. The piezo polarization effect and the spontaneous polarization effect of the channel layer 120 and the barrier layer 130 may act together, leading to the generation of a high concentration of electrons in the interface of the channel layer 120 and the barrier layer 130, known as a two-dimensional electron gas (2DEG).

Then, the capping layer 140 may be formed on the barrier layer 130. The capping layer 140 may be formed by growing a p-GaN layer to a predetermined thickness. As an example, when the GaN layer is grown as a first conductivity type, GaN may be doped with Mg by adding Mg to a source gas of GaN. The etching stop film may be additionally formed between the barrier layer 130 and the capping layer 140.

Figure 6:
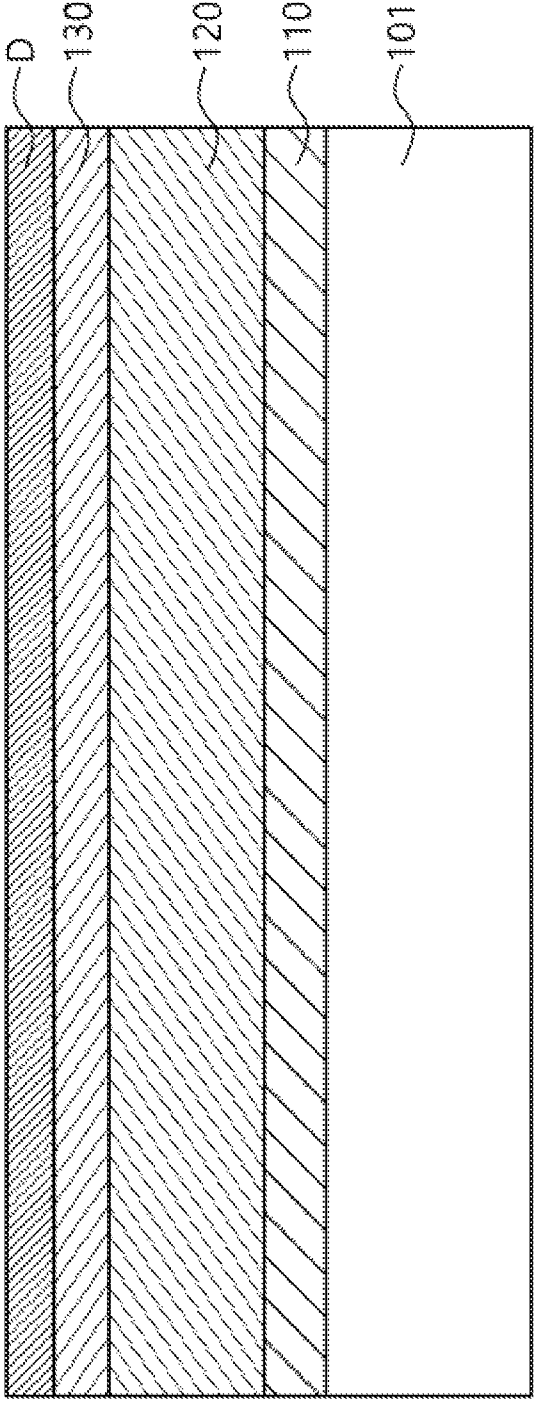
Figure 7:
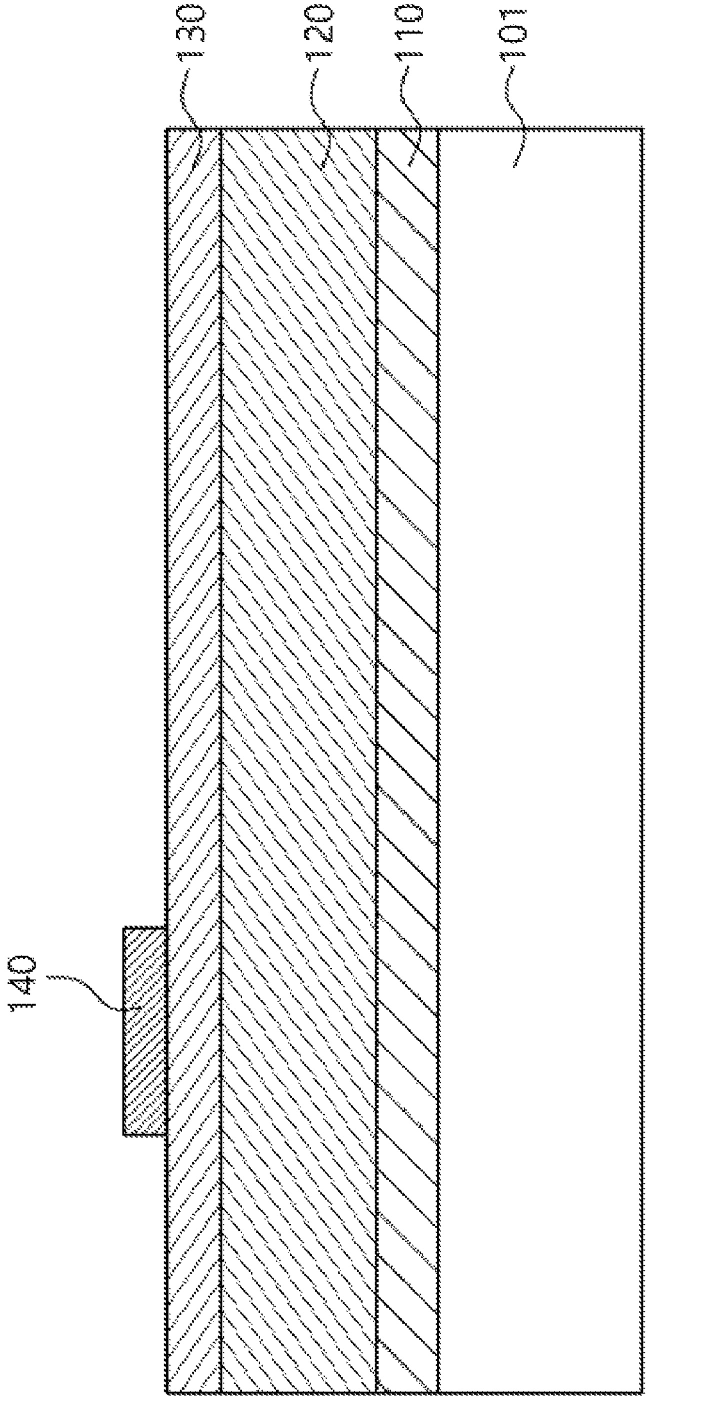

A formation process of the capping layer 140 will be exemplarily described. Referring to FIG. 6, a doped layer D in which a GaN layer is grown as the first conductivity type is formed on the barrier layer 130. Then, referring to FIG. 7, by utilizing a mask pattern (not illustrated), the capping layer 140 may be formed by etching open sides of the doped layer D.

Figure 8:
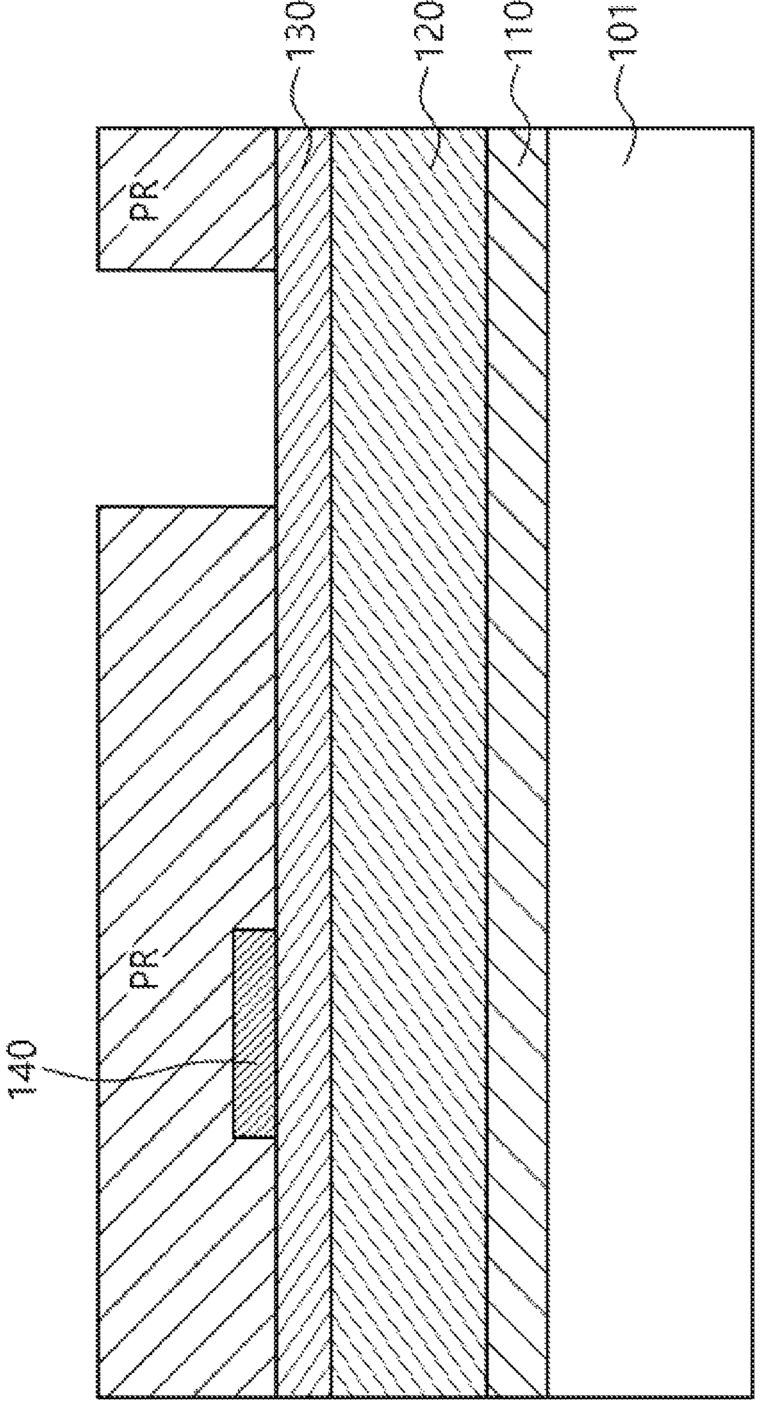
Figure 9:
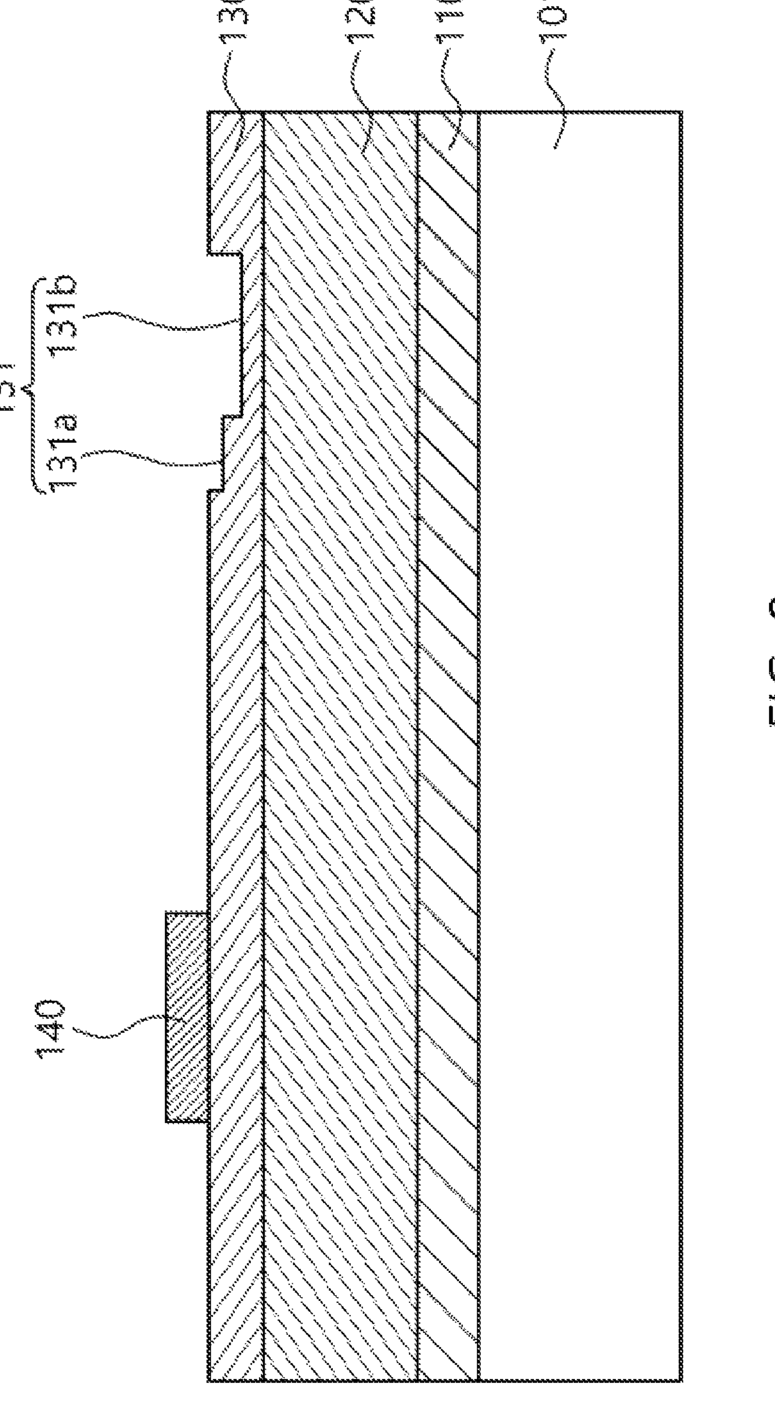

Then, the recess portion 131 is formed on the first side of the barrier layer 130. It is preferable that such a recess portion 131 is formed by performing an etching process on the upper surface of the substantially flat barrier layer 130, and it is more preferable that such a recess portion 131 is formed by performing a plasma etching process. Referring to FIG. 8, firstly, a mask pattern PR is formed on the upper surface of the barrier layer 130, and such a mask pattern PR may be formed in a structure in which a side where the narrow recess portion 131*a* and the wide recess portion 131*b* will be formed is open.

Further, it is preferable that a horizontal width and/or an orthogonal width to an open space at the side where the narrow recess portion 131*a* will be formed is less than a horizontal width and/or an orthogonal width to an open space at the side where the wide recess portion 131*b* will be formed. After then, referring to FIG. 9, by performing a single etching process, the narrow recess portion 131*a* and the wide recess portion 131*b* may be formed together. Herein, a difference in an etch rate may occur due to a difference in line width of the open space of the mask pattern PR.

That is, when an etching area or a size of a pattern varies even if an etching is performed by a plasma having the same density, the narrow recess portion 131*a* and the wide recess portion 131*b* may be formed by utilizing a loading effect in which a density supplied to an etching material during an etching process varies according to a reaction area. Accordingly, a plurality of etching processes for forming each recess portion 131*a* and 131*b* are not required to be performed. In contrast, when two etching processes are performed so as to form each recess portion 131*a* and 131*b*, the barrier layer 130 at border sides of the narrow recess portion 131*a* and the wide recess portion 131*b* is etched more than a required amount, or each recess portion 131*a* and 131*b* may be spaced apart from each other along the horizontal direction due to the two etching processes. Therefore, it is preferable to perform the single etching process.

Figure 10:
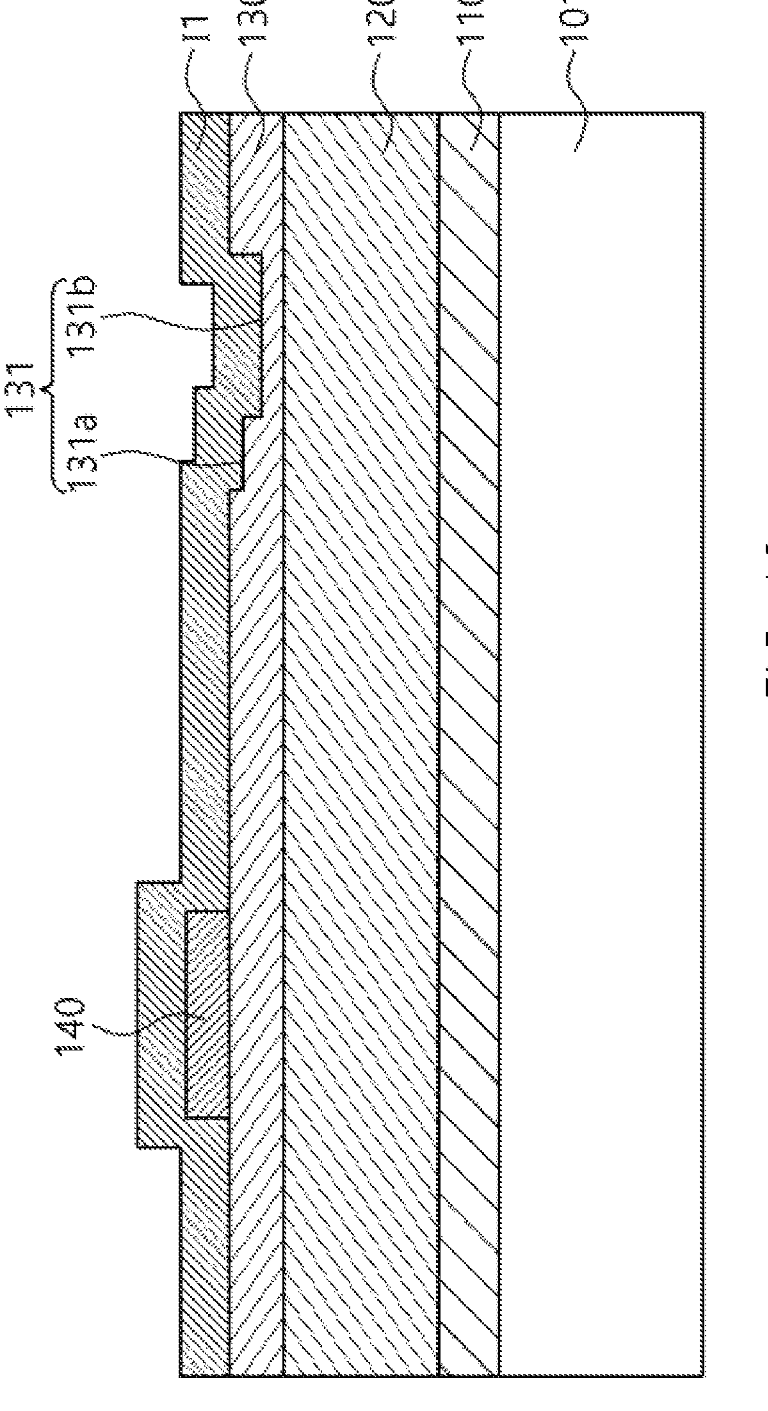
Figure 11:
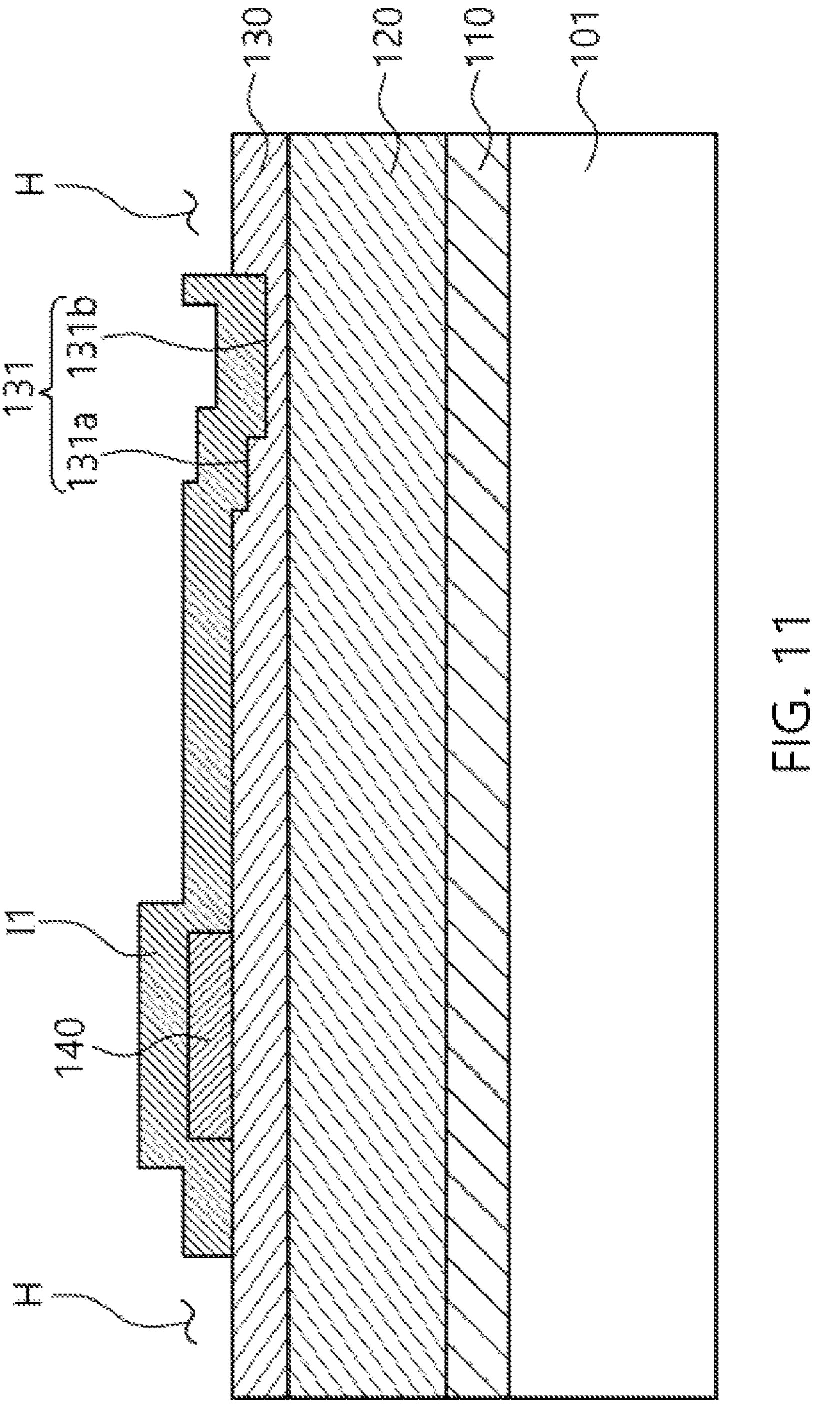

As a subsequent process, referring to FIG. 10, an insulation film layer I1 is formed such that the insulation film layer I1 covers the barrier layer 130 and the capping layer 140. Then, referring to FIG. 11, the openings H are formed at positions where the source electrode 161 and the drain electrode 163 are formed. The openings H may be formed by performing an etching process on open sides after forming a mask pattern (not illustrated) on the insulation film layer I1.

Figure 12:
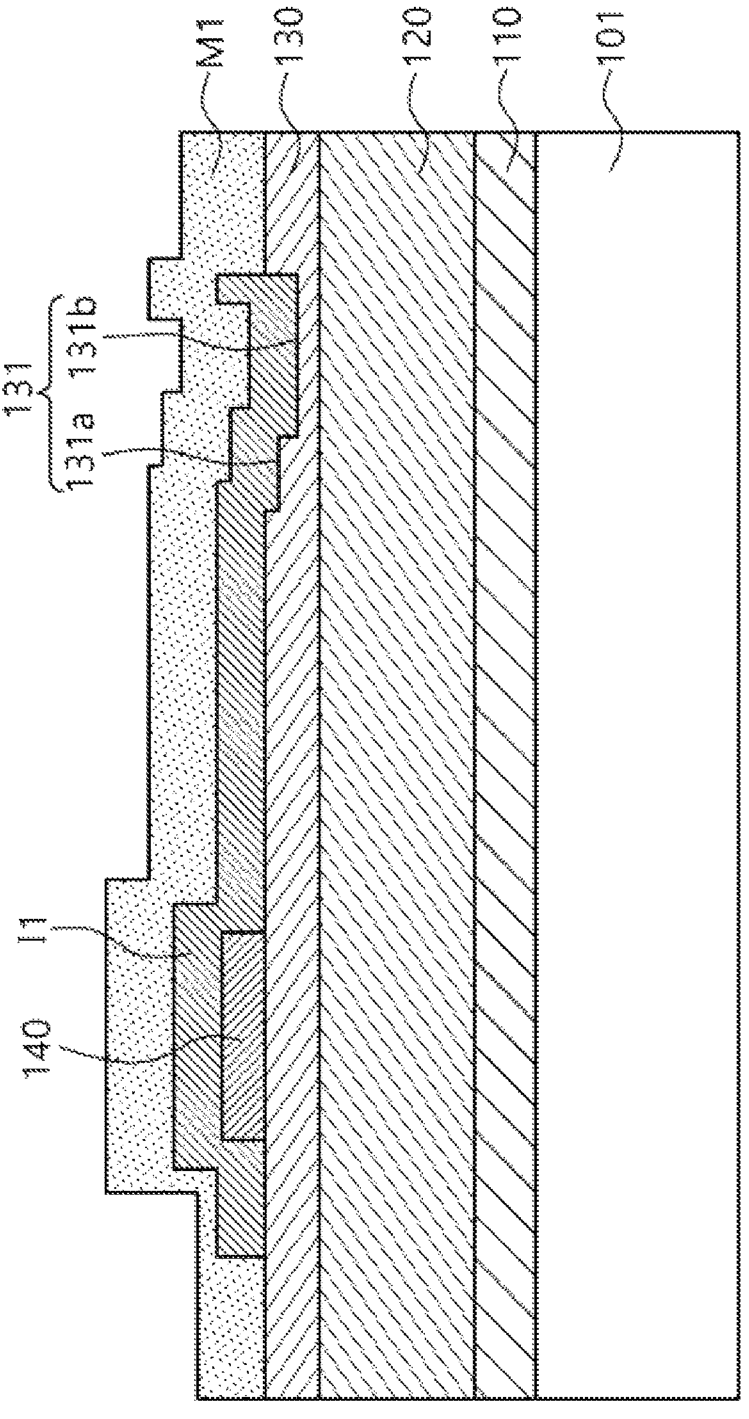
Figure 13:
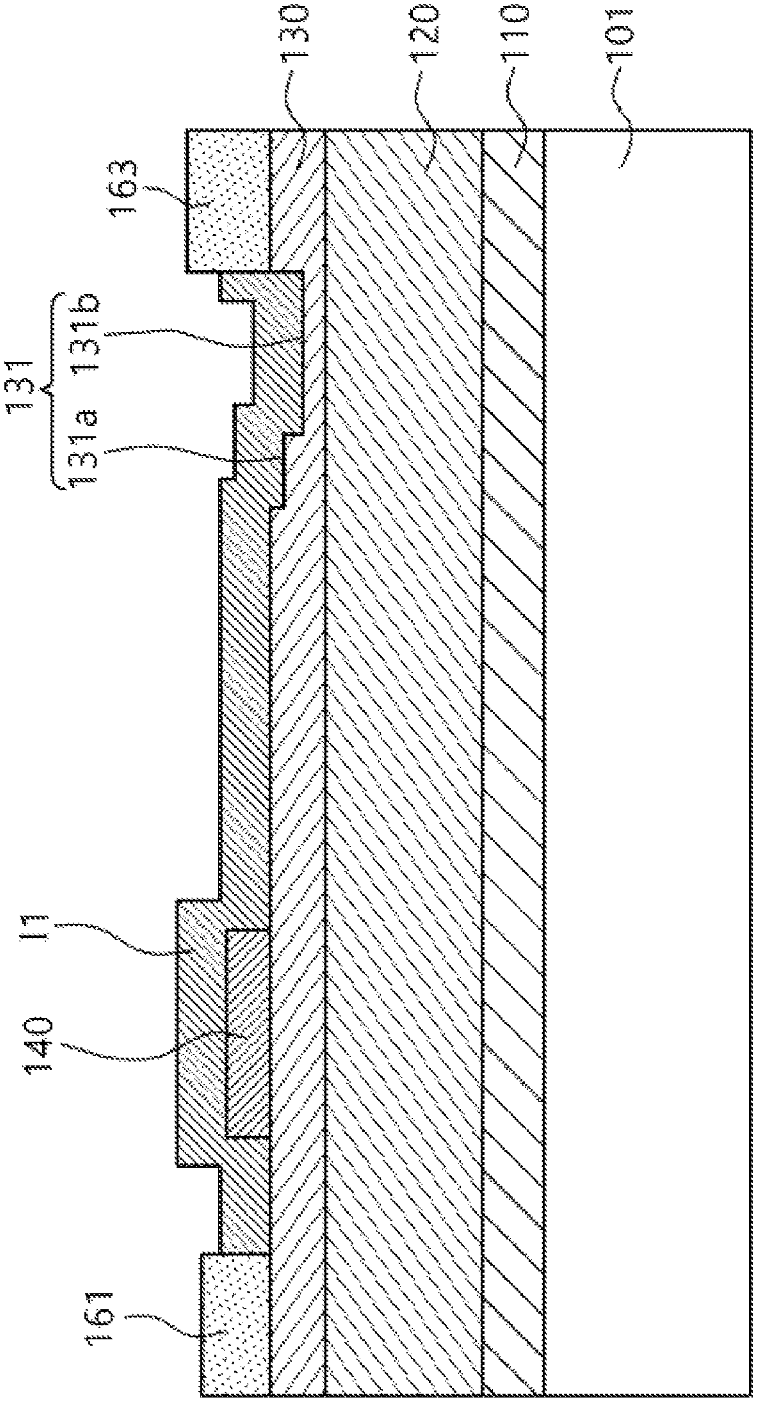
Figure 14:
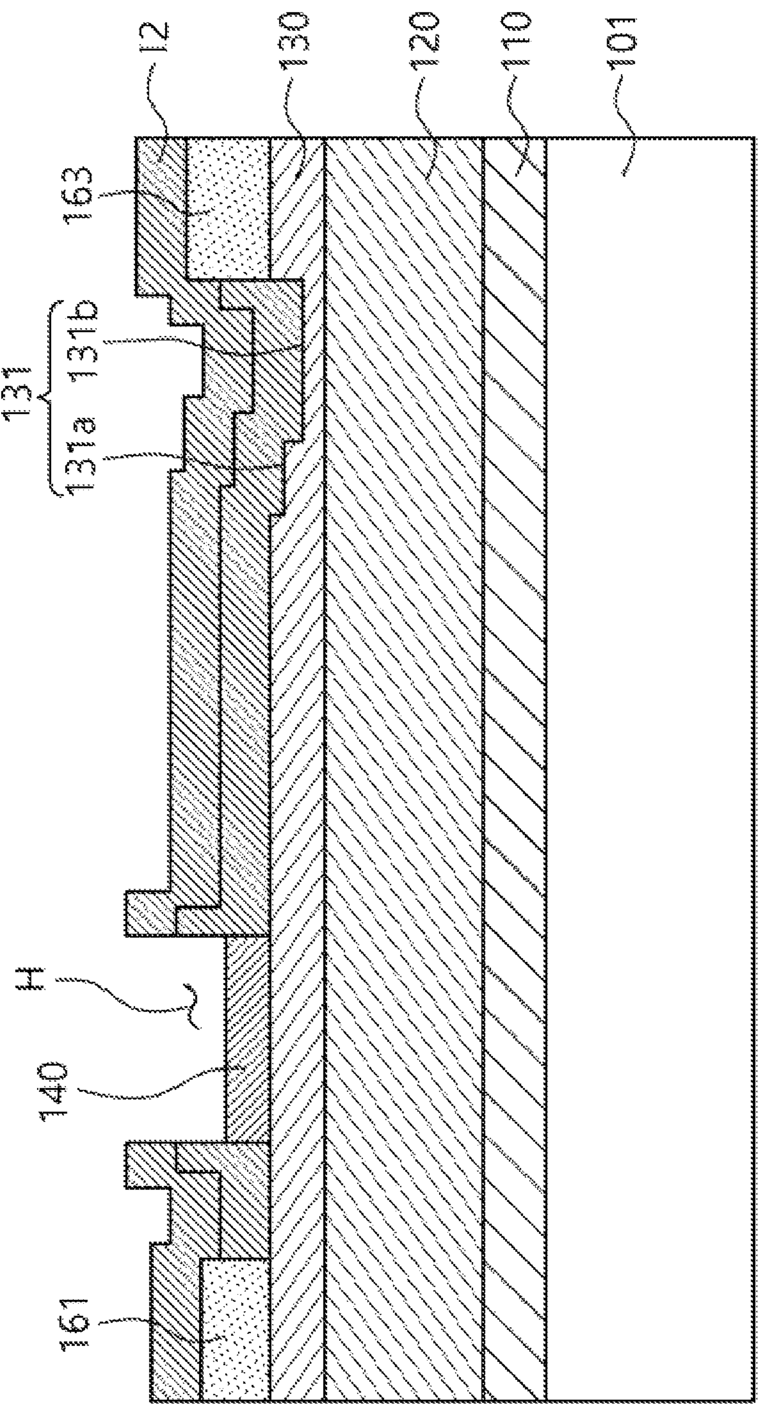
Figure 15:
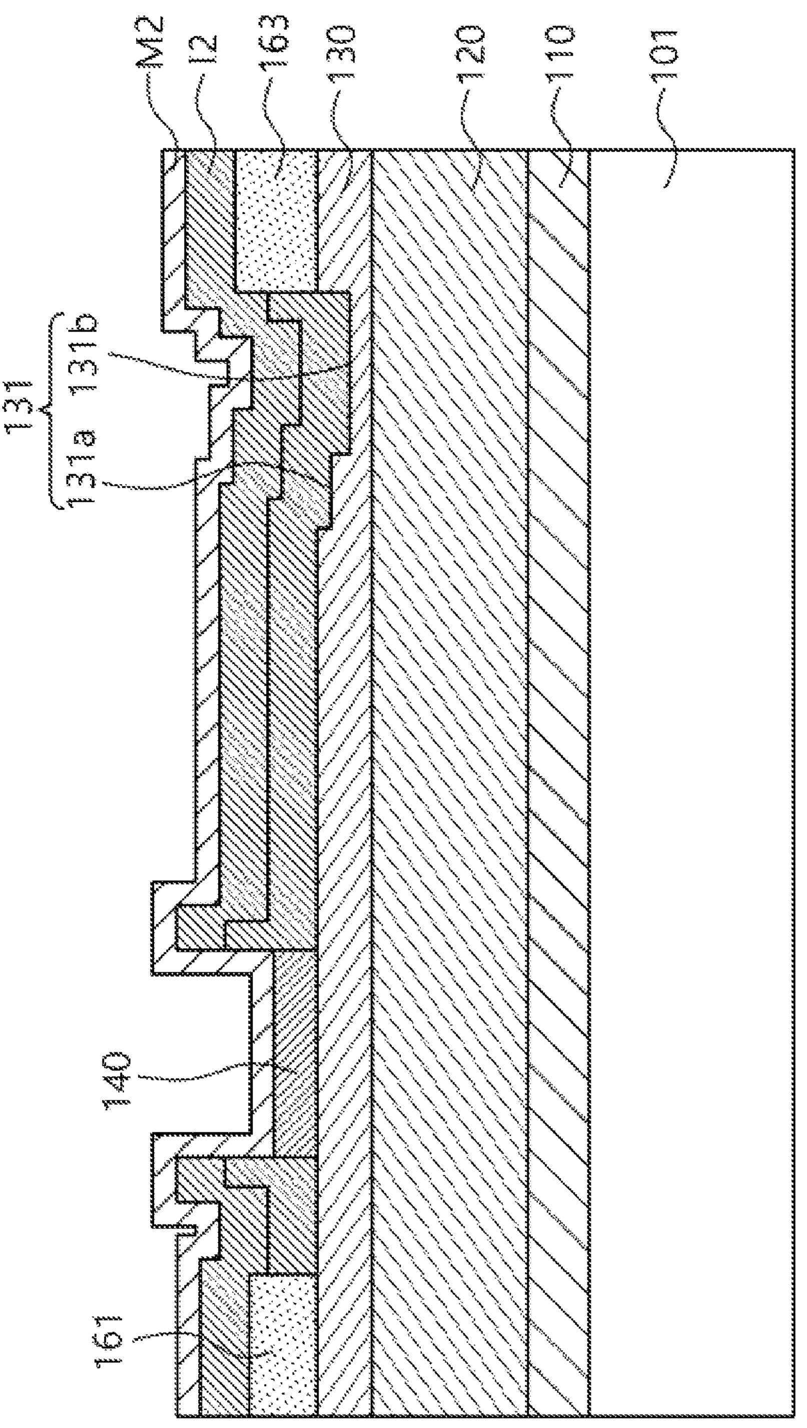
Figure 16:
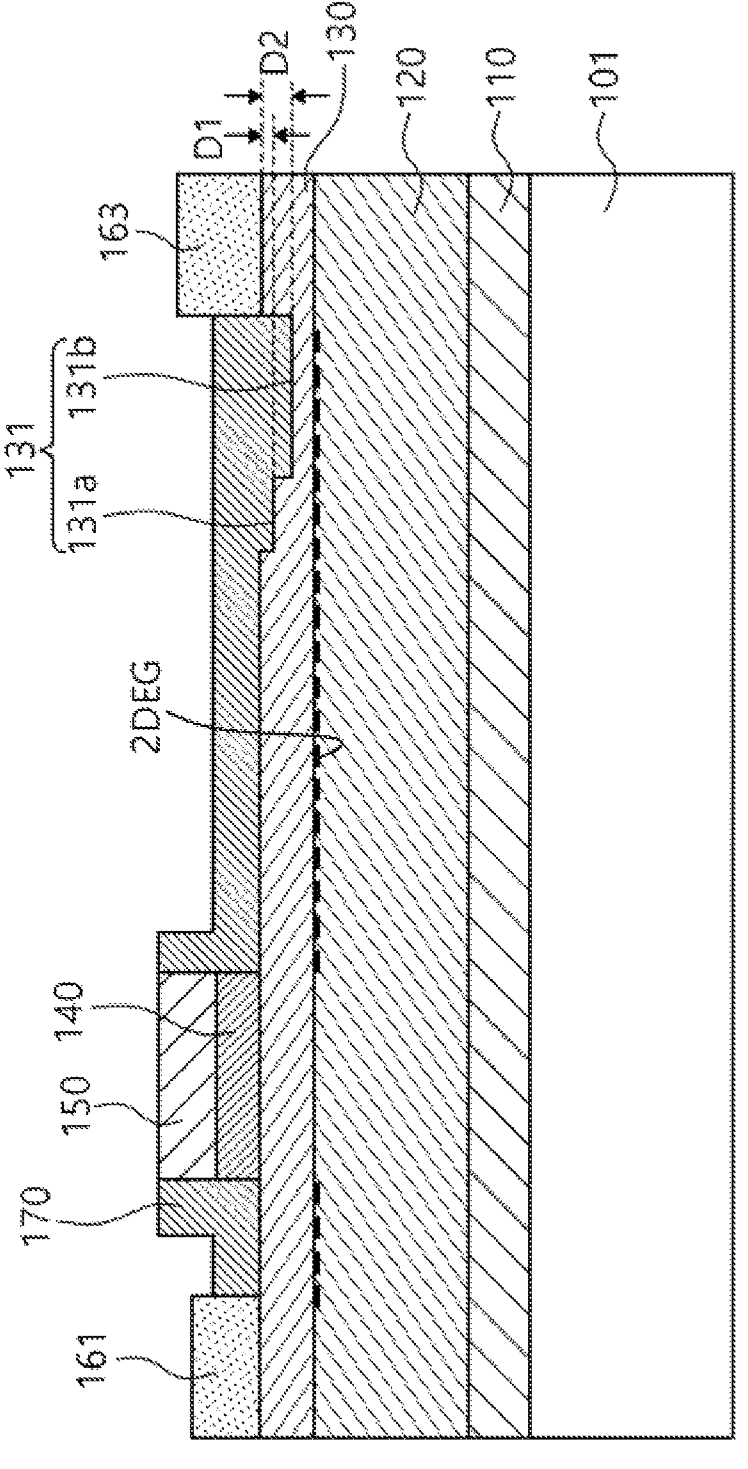

Then, referring to FIG. 12, after a metal layer M1 is deposited on the insulation film layer I1 such that the metal layer M1 fills the openings H, a mask pattern (not illustrated) is formed on the metal layer M1. In addition, referring to FIG. 13, the metal layer M1 is partially removed by utilizing the mask pattern and performing an etching process. Through this process, the source electrode 161, and the drain electrode 163 may be formed.

As a subsequent process, the gate electrode 150 is formed. First, referring to FIG. 14, after the source electrode 161 and the drain electrode 163 are formed, the opening H is formed after an additional insulation film layer I2 is formed on the insulation film layer I1. Such an opening H may be formed at a position exposing an upper surface of the capping layer 140 to the outside. Then, referring to FIG. 15, a metal layer M2 is formed on the source electrode 161 and the drain electrode 163 such that the metal layer M2 fills the opening H. Then, referring to FIG. 16, the gate electrode 150 may be formed by removing the metal layer M2.

The foregoing detailed description is for illustrative purposes only. Further, the description provides an embodiment of the present disclosure and the present disclosure may be used in other various combination, changes, and environments. That is, the present disclosure may be changed or modified within the scope of the present disclosure described herein, a range equivalent to the description, and/or within the knowledge or technology in the related art. The embodiment shows an optimum state for achieving the spirit of the present disclosure, and various modification required for specific applications and uses of the present disclosure are also possible. Therefore, the detailed description of the present disclosure is not intended to limit the present disclosure in the embodiment.

What is claimed is:

1. A power semiconductor device, comprising:
- a substrate;
- a channel layer disposed on or over the substrate;
- a barrier layer disposed on the channel layer;
- a capping layer disposed on the barrier layer;
- a gate electrode disposed on the capping layer;
- a source electrode and a drain electrode that are separated from the gate electrode, the source electrode and the drain electrode forming ohmic contact regions on the barrier layer; and
- an insulation film disposed on the barrier layer,
- wherein the barrier layer is configured such that a first side of an upper surface of the barrier layer is stepped between the gate electrode and the drain electrode,
- wherein the barrier layer comprises a first recess portion and a second recess portion, the first recess portion being spaced apart from an edge of the drain electrode on the upper surface of the barrier layer and being recessed downward, and the second recess portion being recessed downward between the first recess portion and the drain electrode on the upper surface of the barrier layer, and
- wherein the second recess portion has an orthogonal width greater than an orthogonal width of the first recess portion.

2. The power semiconductor device of claim 1, wherein the barrier layer has a stepped structure in which the first side of the upper surface of the barrier layer is recessed downward from the gate electrode to the drain electrode.

3. The power semiconductor device of claim 1, wherein the first recess portion comprises a plurality of first recess sub-portions, and the plurality of first recess sub-portions are spaced apart from each other along an orthogonal direction.

4. The power semiconductor device of claim 1, wherein the second recess portion has a horizontal width greater than a horizontal width of the first recess portion.

5. The power semiconductor device of claim 1, wherein a recessed depth of the second recess portion is greater than a recessed depth of the first recess portion.

6. The power semiconductor device of claim 1, wherein the second recess portion is formed substantially simultaneously with the first recess portion.

7. The power semiconductor device of claim 1, wherein the second recess portion is physically connected to the first recess portion.

8. A power semiconductor device, comprising:
- a substrate;
- a buffer layer disposed on the substrate;
- a channel layer disposed on or over the substrate, the channel layer being a nitride-based semiconductor layer;
- a barrier layer disposed on the channel layer, the barrier layer being a nitride-based semiconductor layer that is different from the channel layer;
- a capping layer disposed on the barrier layer;
- a gate electrode disposed on the capping layer; and
- a source electrode and a drain electrode that are separated from the gate electrode, the source electrode and the drain electrode forming ohmic contact regions on the barrier layer,
- wherein the barrier layer comprises a recess portion that comprises:
- a narrow recess portion positioned between the drain electrode and the gate electrode; and
- a wide recess portion positioned between the narrow recess portion and the drain electrode, the wide recess portion being connected to the narrow recess portion, and
- wherein the recess portion has a pair of narrow recess portions respectively connected to a pair of wide recess portions, and wherein the recess portion has an additional narrow recess portion of an island structure, the additional narrow recess portion being positioned between the pair of narrow recess portions in an orthogonal direction thereof.

9. The power semiconductor device of claim 8, wherein the recess portion comprises a plurality of recess sub-portions, and the plurality of recess sub-portions are spaced apart from each other along an orthogonal direction on an upper surface of the barrier layer.

10. The power semiconductor device of claim 8, wherein each narrow recess portion has a horizontal central axis that is substantially parallel to a horizontal central axis of each wide recess portion to which the each narrow recess portion is connected.

11. The power semiconductor device of claim 8, wherein a recessed depth of each wide recess portion is greater than a recessed depth of each narrow recess portion connected to the each wide recess portion, so that a first side of an upper surface of the barrier layer has a stepped structure that is recessed downward from the gate electrode to the drain electrode.

12. The power semiconductor device of claim 8, wherein the recess portion is formed by a plasma etching process.

* * * * *